US008642454B2

(12) United States Patent
Brabant et al.

(10) Patent No.: US 8,642,454 B2
(45) Date of Patent: Feb. 4, 2014

(54) LOW TEMPERATURE SELECTIVE EPITAXY OF SILICON GERMANIUM ALLOYS EMPLOYING CYCLIC DEPOSIT AND ETCH

(75) Inventors: Paul D. Brabant, Scodack, NY (US); Keith Chung, Guilderland, NY (US); Hong He, Schenectady, NY (US); Devendra K. Sadana, Pleasantville, NY (US); Manabu Shinriki, Albany, NY (US)

(73) Assignees: International Business Machines Corporation, Armonk, NY (US); Matheson Tri-Gas, Inc., Basking Ridge, NJ (US)

( * ) Notice: Subject to any disclaimer, the term of this patent is extended or adjusted under 35 U.S.C. 154(b) by 74 days.

(21) Appl. No.: 13/475,503

(22) Filed: May 18, 2012

(65) Prior Publication Data

US 2012/0295421 A1 Nov. 22, 2012

Related U.S. Application Data

(60) Provisional application No. 61/487,795, filed on May 19, 2011.

(51) Int. Cl.
*H01L 21/36* (2006.01)
*H01L 21/20* (2006.01)
(52) U.S. Cl.
USPC ........................................ 438/481; 438/478
(58) Field of Classification Search
USPC .................................... 438/478, 481
See application file for complete search history.

(56) References Cited

U.S. PATENT DOCUMENTS 7,122,449 B2 * 10/2006 Langdo et al. ............... 438/481
7,838,963 B2 * 11/2010 Chidambarrao et al. ..... 257/529

OTHER PUBLICATIONS

Tamura, N. et al., "45 nm CMOS Technology with Low Temperature Selective Epitaxy of SiGe" Applied Surface Science (Jul. 30, 2008) pp. 6067-6071, vol. 254, issue 19.
Ghani, T. et al., "A 90nm High Volume Manufacturing Logic Technology Featuring Novel 45 nm Gate Length Strained Silicon CMOS Transistors" Portland Technology Development, TCAD, QRE, Intel Corp., Electron Devices Meeting—Tech Digest (Dec. 8-10, 2003) Hillsboro, OR.
Sturm, J.C. et al., "Chemical Vapor Deposition Epitaxy of Silicon-based Materials Using Neopentasilane" ECS Transactions (Oct. 2008) pp. 799-805, vol. 16, No. 10.

(Continued)

*Primary Examiner* — Luan C Thai
(74) *Attorney, Agent, or Firm* — Scully, Scott, Murphy & Presser, P.C.; Louis J. Percello, Esq.

(57) ABSTRACT

Cyclic deposit and etch (CDE) selective epitaxial growth employs an etch chemistry employing a combination of hydrogen chloride and a germanium-containing gas to provide selective deposition of a silicon germanium alloy at temperatures lower than 625° C. High strain epitaxial silicon germanium alloys having a germanium concentration greater than 35 atomic percent in a temperature range between 400° C. and 550° C. A high order silane having a formula of $SinH2n+2$, in which n is an integer greater than 3, in combination with a germanium-containing precursor gas is employed to deposit the silicon germanium alloy with thickness uniformity and at a high deposition rate during each deposition step in this temperature range. Presence of the germanium-containing gas in the etch chemistry enhances the etch rate of the deposited silicon germanium alloy material during the etch step.

25 Claims, 10 Drawing Sheets

(56) References Cited

OTHER PUBLICATIONS

Bogumilowicz, Y. et al., "Chemical Vapour Etching of Si, SiGe and Ge with HCl; Applications to the Formation of Thin relaxed SiGe Buffers and to the Revelation of Threading Dislocations" Semiconductor Science Technology (Feb. 2005) pp. 127-134, vol. 20, issue 2.

Hartmann, J.M. et al., "Effect of HCl on the SiGe Growth Kinetics in Reduced Pressure-Chemical Vapor Deposition" Journal of Crystal Growth (May 2002) pp. 93-100, vol. 241.

Kamins, T.I. et al., "Kinetics of Selective Epitaxial Deposition of $Si_{1-x}Ge_x$" Applied Physics Letters (Aug. 10, 1992) pp. 669-671, vol. 61, No. 6.

\* cited by examiner

LOW TEMPERATURE SELECTIVE EPITAXY OF SILICON GERMANIUM ALLOYS EMPLOYING CYCLIC DEPOSIT AND ETCH

CROSS-REFERENCES TO RELATED APPLICATIONS

The application claims the benefit of priority from a U.S. Provisional Application No. 61/487,795, filed on May 19, 2011, the entire content and disclosure of which is incorporated herein by reference.

BACKGROUND

The present disclosure generally relates to a method of forming semiconductor structures, and more particularly to a method for low temperature selective epitaxy of silicon germanium alloys employing cyclic deposit and etch, and a system for implementing the same.

Embedded silicon germanium alloys can be employed to improve performance of p-type field effect transistors (PFET's) by introducing compressive stress to the channel. Specifically, embedded epitaxial silicon germanium alloys within source regions and drain regions can generate compressive strain in the silicon channel of a field effect transistor. Such compressive stress along the direction of the channel increases the mobility of holes in a p-type metal-oxide-semiconductor field effect transistor (PMOSFET). The increase in the mobility of holes in the PMOSFET results in an increase in the on-current of the PMOSFET.

The lattice constant of germanium is greater than the lattice constant of silicon by about 4.2%. The greater the content of substitutional (i.e., non-interstitial) germanium in an embedded silicon germanium alloy source or drain regions, the greater the compressive stress applied to the silicon channel of a PMOSFET.

Strain scaling of PFET's has been accomplished by increasing the concentration of germanium in embedded silicon germanium alloy materials. For example, at 90 nm complementary metal-oxide-semiconductor (CMOS) technology node, germanium concentrations less than 20 atomic percent were employed for embedded silicon germanium alloys for PFET's. It is estimated that for 22 nm CMOS technology node, a germanium concentration greater than 35 atomic percent is required to provide sufficient compressive stress to the silicon channel of a PMOSFET. Further strain enhancement is required for 22 nm CMOS technology due to disproportionate reduction in device area per generation caused by non-scaled gate length.

However, the lattice mismatch between silicon and germanium causes misfit dislocations and stacking faults through relaxation in high concentration silicon germanium alloy films having a thickness exceeding the metastable thickness, i.e., the germanium-concentration-dependent critical thickness beyond which the silicon germanium film relaxes. Thus, relaxation of strain within a silicon germanium material having a germanium concentration greater than 35 atomic percent during epitaxial growth and subsequent processing is a major concern for enabling further device scaling at 22 nm CMOS technology and beyond.

As known in the art, selective deposition of a silicon germanium alloy epitaxial film can be performed by concurrently flowing a silicon containing reactant such as silane or disilane, a germanium-containing reactant such as germane, and hydrogen chloride as an etchant at temperatures higher than 625° C. However, silicon germanium alloy epitaxial films formed by such selective deposition methods are not capable of being fully-strained for germanium concentrations greater than 45 atomic percent. At temperatures lower than 625° C., the conventional selective deposition process for a silicon germanium alloy fails because hydrogen chloride provides only negligible etch rates, thereby rendering selectivity unattainable during epitaxial growth.

Further, it has been suggested that, for non-selective deposition of silicon germanium alloy materials, in order to form a fully strained silicon germanium alloy having a germanium concentration greater than 45 atomic percent, the non-selective deposition temperature needs to be lowered to 500° C. or below.

BRIEF SUMMARY

A selective epitaxial growth uses an etch chemistry employing a combination of hydrogen chloride and a germanium-containing gas to provide selective deposition of a silicon germanium alloy at temperatures lower than 625° C. High strain epitaxial silicon germanium alloys having a germanium concentration greater than 35 atomic percent in a temperature range between 400° C. and 550° C. A high order silane having a formula of $Si_nH_{2n+2}$, in which n is an integer greater than 3, in combination with a germanium-containing precursor gas is employed to deposit the silicon germanium alloy with thickness uniformity and at a high deposition rate during each deposition step in this temperature range. Presence of the germanium-containing gas in the etch chemistry enhances the etch rate of the deposited silicon germanium alloy material during the etch step. The selective epitaxy process can be a cyclic deposit and etch (CDE) process. The low temperature growth method of the present disclosure provides meta-stable pseudomorphic silicon germanium alloys with high germanium concentrations that preserve strain without relaxation.

According to an aspect of the present disclosure, a method of depositing a silicon germanium alloy material is provided. The method includes performing at least one deposition step that deposits a silicon germanium alloy material on a substrate by flowing a high order silane gas having a chemical formula of $Si_nH_{2n+2}$ and a germanium precursor gas as reactant gases into a process chamber including the substrate. N is an integer greater than 3. The method further includes performing at least one etch step that etches at least a portion of the deposited silicon germanium alloy material by flowing a combination of a hydrogen chloride gas and a germanium-containing gas into the process chamber.

According to another aspect of the present disclosure, a system for depositing a silicon germanium alloy material is provided. The system includes a process chamber connected to an inlet gas manifold on one side and an exhaust manifold on another side and including a susceptor configured to hold a wafer therein. The system further includes a process control device configured to control temperature and pressure of the process chamber and to control a gas flow into the process chamber. The process control device is configured to perform at least one deposition step that deposits a silicon germanium alloy material on a substrate by flowing a high order silane gas having a chemical formula of $Si_nH_{2n+2}$ and a germanium precursor gas as reactant gases into a process chamber including the substrate. N is an integer greater than 3. The process control device is further configured to perform at least one etch step that etches at least a portion of the deposited silicon germanium alloy material by flowing a combination of a hydrogen chloride gas and a germanium-containing gas into the process chamber.

DETAILED DESCRIPTION

As stated above, the present disclosure relates to a method for low temperature selective epitaxy of silicon germanium alloys employing cyclic deposit and etch, and a system for implementing the same. Aspects of the present disclosure are now described in detail with accompanying figures.

Figure 1:
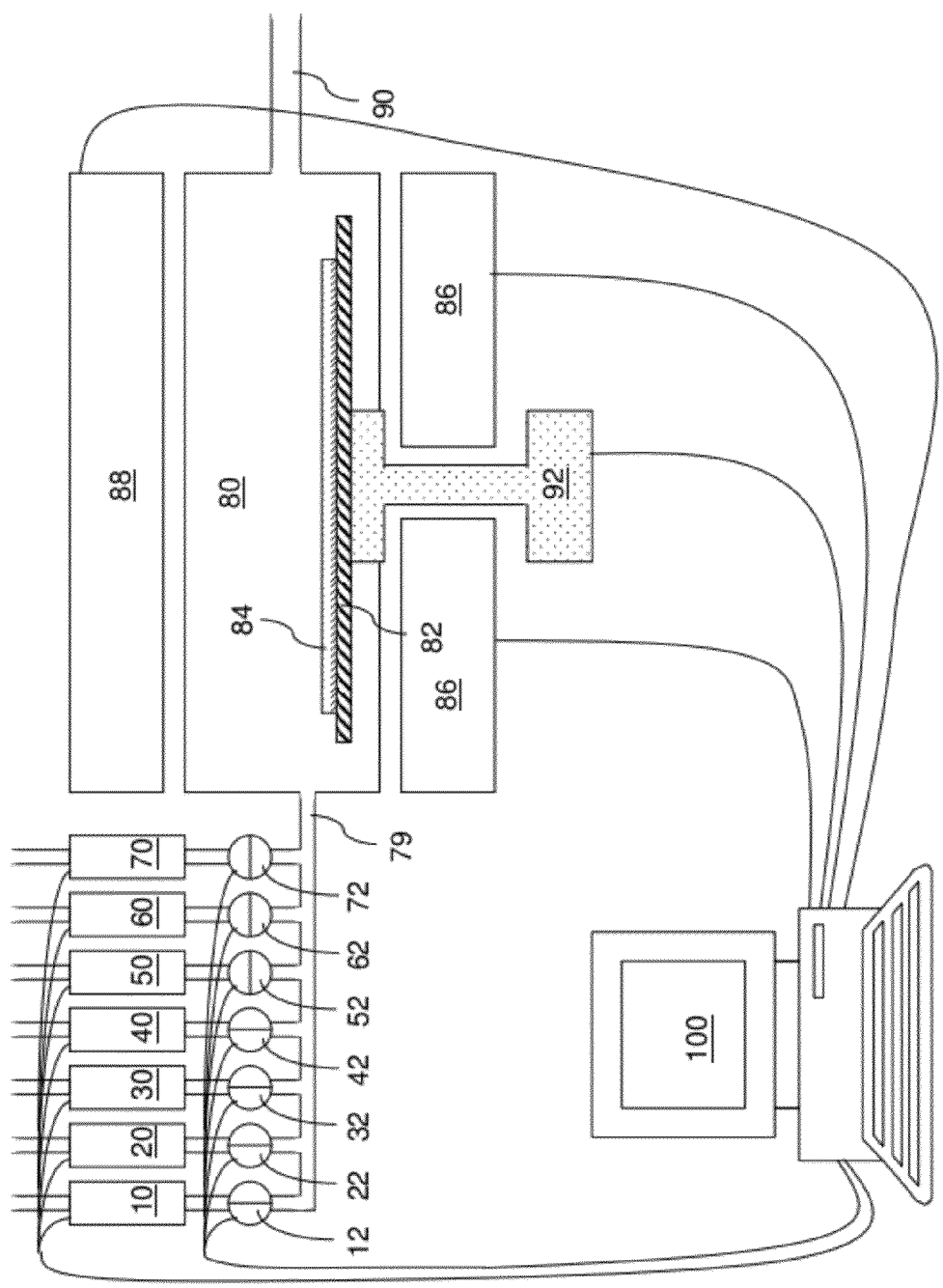
FIG. 1 is a schematic diagram illustrating an exemplary apparatus configured for silicon germanium selective epitaxy process employing cyclic deposit and etch (CDE) during a deposition step according to an embodiment of the present disclosure.
Figure 2:
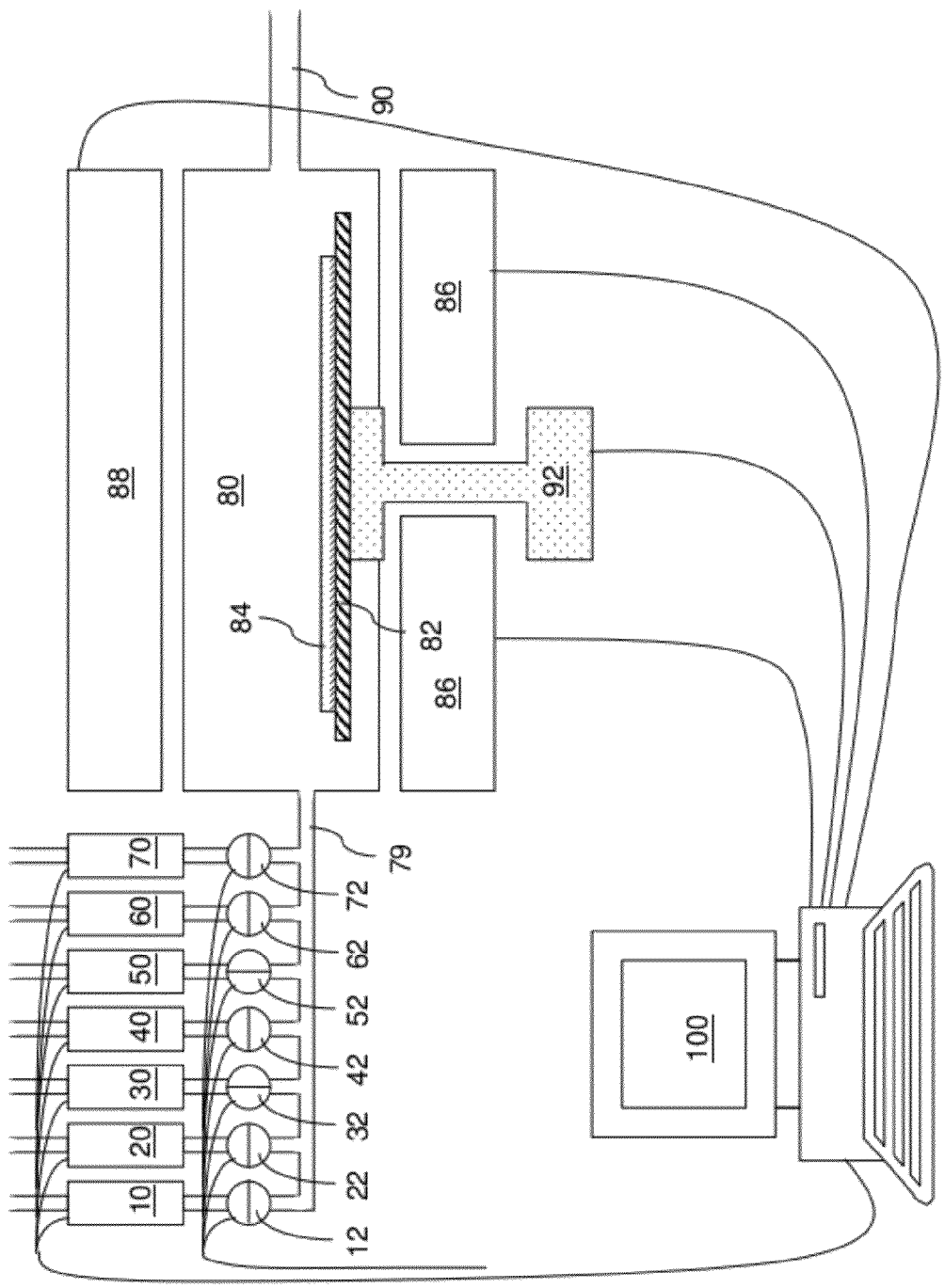
FIG. 2 is a schematic diagram illustrating an exemplary apparatus configured for silicon germanium selective epitaxy process employing cyclic deposit and etch (CDE) during an etch step according to an embodiment of the present disclosure.

Referring to FIGS. 1 and 2, an exemplary apparatus configured for silicon germanium selective epitaxy process employing cyclic deposit and etch (CDE) is illustrated. FIG. 1 shows the exemplary apparatus during a deposition step, and FIG. 2 shows the exemplary apparatus during an etch step. The CDE silicon germanium selective epitaxy process can employ deposition steps and etch steps alternately to provide selectivity of growth of a single crystalline epitaxial silicon germanium alloy material on single crystalline surfaces of a semiconductor substrate, while preventing cumulative deposition of an amorphous or polycrystalline silicon germanium alloy material on dielectric surfaces such as surfaces of a silicon oxide surfaces and silicon nitride surfaces of a patterned semiconductor substrate.

The exemplary apparatus is configured to provide process gases, etch gases, and purge gases to a process chamber 80, which can be configured as a reduced pressure process chamber configured to operate in a pressure range from 1 Torr and 300 Torr during deposition steps and etch steps. An inlet gas manifold 79 is provided on one side of the process chamber 80, and an exhaust manifold 90 is provided on the other side of the process chamber 80. The exhaust manifold 90 is connected to a vacuum pump (not shown) and a scrubber (not shown). Alternatively, the process chamber 80 can be configured to operate at, or close to, atmospheric pressure (760 Torr).

A susceptor 82 is located in the process chamber 80. The susceptor 82 is configured to hold a wafer 84, which is a semiconductor substrate such as a blanket silicon substrate or a patterned substrate including single crystalline silicon portions. In one embodiment, the susceptor 82 can have a thermal mass greater than the thermal mass of the wafer 84 to facilitate heating of the wafer 84 once the wafer is placed on the susceptor. In one embodiment, the susceptor 84 can be configured to rotate while holding the wafer 84, thereby providing a rotation to the wafer 84 to enhance the uniformity of the silicon germanium film deposited on the wafer 84.

The process chamber 80 can have a transparent enclosure to let in radiation from external heating elements. A lower temperature control unit 86 and an upper temperature control unit 88 can be provided below, and above, the process chamber 80, respectively. Each of the lower temperature control unit 86 and the upper temperature control unit 88 can include heating elements, a pyrometer, and a temperature control feedback circuitry designed to control the power supplied to the heating elements in order to stabilize the temperature of the susceptor 82 and the wafer 84 at a target temperature.

The exemplary apparatus can be configured to provide a carrier gas to the process chamber 80 through a first mass flow controller (MFC) 10 and a first valve 12. The first valve 12 is normally closed, and is opened when the carrier gas flows into the process chamber 80. The first MFC 10 controls the flow rate of the carrier gas into the process chamber 80. In one embodiment, the first MFC 10 can be configured to provide a flow rate in a range from 1 standard liter per minute (slm) to 1,000 slm. The carrier gas can be, for example, hydrogen gas, helium gas, nitrogen gas, argon gas, or a combination thereof.

Process gases can include a high order silane gas that is provided into the process chamber 80 through a second MFC 20 and a second value 22 from a high order silane source. As used herein, a "high order silane" refers to $Si_nH_{2n+2}$ compounds in which n is greater than 3. For example, high order silanes that can be employed for the purposes of the present disclosure include $Si_4H_{10}$, $Si_5H_{12}$, $Si_6H_{14}$, $Si_7H_{16}$, $Si_8H_{18}$, $Si_9H_{20}$, etc. The high order silane gas source can be a bubbler that is configured to provide a vapor of the high order silane in a carrier gas, which can be, for example, hydrogen gas, helium gas, nitrogen gas, argon gas, or a combination thereof. The vapor pressure of the high order silane gas can be controlled within a target range by controlling the temperature of the bubbler. The second shut-off valve 22 is normally closed, and is opened when the high order silane gas flows into the process chamber 80. In one embodiment, the second MFC 20 can be configured to provide a flow rate in a range from 10 standard cubic centimeters per minute (sccm) to 10 slm.

A germanium precursor gas can be provided into the process chamber 80 through a third MFC 30 and a third value 32 from a germanium precursor gas source. The germanium precursor gas can be germane ($GeH_4$) or digermane ($Ge_2H_6$) or germanium tetrachloride ($GeCl_4$). The germanium precursor gas can be provided from a compressed gas tank. The third shut-off valve 32 is normally closed, and is opened when the germanium precursor gas flows into the process chamber 80.

In one embodiment, the third MFC 30 can be configured to provide a flow rate in a range from 10 sccm to 10 slm.

A dopant gas can be provided into the process chamber 80 through a fourth MFC 40 and a fourth value 42 from a dopant gas source, which can be a compressed gas tank. The dopant gas can be diborane ($B_2H_6$), phosphine ($PH_3$), arsine ($AsH_3$), or stibine ($SbH_3$). In one embodiment, the dopant gas can be diborane. The fourth shut-off valve 42 is normally closed, and is opened when the dopant gas flows into the process chamber 80. In one embodiment, the fourth MFC 40 can be configured to provide a flow rate in a range from 1 sccm to 1 slm.

Hydrogen chloride (HCl) gas can be provided into the process chamber 80 through a fifth MFC 50 and a fifth value 52 from a hydrogen chloride source, which can be a compressed tank including hydrogen chloride. The fifth shut-off valve 52 is normally closed, and is opened when the germanium-containing gas flows into the process chamber 80. In one embodiment, the fifth MFC 50 can be configured to provide a flow rate in a range from 100 sccm to 100 slm.

A purge gas can be provided into the process chamber 80 through a sixth MFC 60 and a sixth value 62 from a purge gas source, which can be a compressed tank including the purge gas. The purge gas can be nitrogen. The sixth shut-off valve 62 is normally open, and is closed when the purge gas does not flow into the process chamber 80. In one embodiment, the sixth MFC 60 can be configured to provide a flow rate in a range from 100 sccm to 100 slm.

Optionally, a germanium-containing gas that is different from the germanium precursor can be provided into the process chamber 80 through a seventh MFC 70 and a seventh value 72 from a germanium-containing gas source. The germanium-containing gas can be, for example, germanium tetrachloride ($GeCl_4$) or germanium tetrafluoride ($GeF_4$). Alternately, if the germanium source gas one of germane ($GeH_4$) and digermane ($Ge_2H_6$), the germanium-containing gas can be the other of germane and digermane. The germanium-containing gas can be provided from a compressed gas tank, or can be provided by any other alternate means for providing the germanium-containing gas as known in the art. The seventh shut-off valve 72 is normally closed, and is opened when the germanium-containing gas flows into the process chamber 80. In one embodiment, the seventh MFC 70 can be configured to provide a flow rate in a range from 10 sccm to 10 slm.

The wafer 84 can be a patterned semiconductor substrate including at least one physically exposed semiconductor surface and at least one physically exposed dielectric surface. In one embodiment, the wafer 84 can include at least one physically exposed silicon surface and at least one physically exposed dielectric surface. The CDC silicon germanium selective epitaxy can be performed by alternately performing a deposition step and an etch step.

A susceptor motion control assembly 92 can be provided to move the susceptor 82 during the deposition step and etch steps. The susceptor motion control assembly 92 can be configured to rotate the susceptor around the center axis of the susceptor 82, thereby rotating the wafer 82 during the deposition steps and the etch steps. In one embodiment, the susceptor motion control assembly 92 can include a motor located outside a vacuum enclosure of the process chamber 80, a magnetic coupling device, and a rotation axis structure connected to the susceptor 82 and attached to inner components of the magnetic coupling device. The susceptor motion control assembly 92 can rotate the wafer 84, for example, at a rate from 0.2 revolution per minute (rpm) to 60 rpm.

The exemplary apparatus can further include a process control device 100, which can be a computer, a set of interconnected computers, a dedicated standalone computing device, a portable computing device, or any other type of device capable of controlling the pressure and temperature of the process chamber 80 and the gas flow into the process chamber 80 by activating each of the valves (12, 22, 32, 42, 52, 62, 72) and the MFC's (10, 20, 30, 40, 50, 60, 70). Further, the process control device 100 can be configured to run a process control program, or a "process recipe," that specifies target process parameters for performing each of the deposition steps and each of the etch steps. For example, the process control program can include specifications for target temperatures, target pressures, and target gas flow rates for each of the gases controlled by the valves (12, 22, 32, 42, 52, 62, 72) and the MFC's (10, 20, 30, 40, 50, 60, 70) at each stage of the deposition steps and at each stage of the etch steps. In one embodiment, the process control device can be configured to perform the plurality of deposition steps and the plurality of etch steps as a series of alternately performed deposition steps and etch steps.

Referring to FIG. 1, during each deposition step, an undoped or doped silicon germanium alloy material is formed on the wafer. The second shut-off value 22 and the third shut-off value 32 are opened, and the second MFC 20 and the third MFC 30 are controlled to allow simultaneous flow of the high order silane gas and the germanium precursor gas into the process chamber 80. Optionally, the first shut-off value 12 can be opened and the first MFC 10 can be controlled to allow the carrier gas to flow into the process chamber with the combination of the high order silane gas and the germanium precursor gas. The combination of the high order silane gas and the germanium precursor gas can be employed deposit a high quality silicon germanium alloy at a high growth rate at low temperatures. The high order silane is employed as the silicon precursor, and germane or digermane can be employed as the germanium precursor.

The high order silane gas and the germanium precursor gas can be delivered into the process chamber 80 with or without the carrier gas. The partial pressure of the high order silane gas during the deposition step can be from 0.1 mTorr to 10 Torr. The partial pressure of the germanium precursor gas during the deposition step can be from 0.1 mTorr to 10 Torr. The ratio of the partial pressure of the high order silane gas to the partial pressure of the germanium precursor gas can be from 0.001 to 1,000, although lesser and greater ratios can also be employed. The atomic percentage of germanium atoms relative to the total semiconductor atoms (i.e., the silicon atoms and the germanium atoms) in the deposited undoped or doped silicon alloy can be from nearly 0% to nearly 100%. Thus, the atomic percentage of germanium within the doped or undoped silicon germanium alloy can be varied from 0% to 100% by adjusting the ratio of the flow rates of the high order silane gas and the germanium precursor gas, and by adjusting the deposition temperature and pressure during the deposition step.

The temperature of the wafer 84 during the deposition step can be in a range from, and including, 400° C. to, and including, 550° C. In one embodiment, the temperature of the wafer 84 during the deposition step can be in a range from, and including, 430° C. to, and including, 530° C. In yet another embodiment, the temperature of the wafer 84 during the deposition step can be in a range from, and including, 460° C. to, and including, 510° C.

The total pressure of the process chamber 80 during the deposition step can be from 3 Torr to 300 Torr, although lesser and greater pressures can also be employed.

The use of the high order silane gas provides a significant increase in the deposition rate in the temperature range from, and including, 400° C. to, and including, 550° C. relative to a deposition process employing monosilane (SiH$_4$) or disilane (Si$_2$H$_6$). While germane or digermane can be employed to provide a high deposition rate for a silicon germanium alloy material, digermane can provide a higher deposition rate at the same temperature. In one embodiment, the deposition rate for single crystalline silicon germanium alloy can be from 1 nm/min to 30 nm/min, although lesser and greater deposition rates can also be used. In another embodiment, the deposition rate for single crystalline silicon germanium alloy can be from 5 nm/min to 30 nm/min. In yet another embodiment, the deposition rate for single crystalline silicon germanium alloy can be from 10 nm/min to 30 nm/min.

Portions of the undoped or doped silicon germanium alloy material deposited on single crystalline semiconductor surfaces (such as single crystalline silicon surfaces) are epitaxially aligned to the underlying single crystalline semiconductor material, and become epitaxial silicon germanium alloy portions. Portions of the undoped or doped silicon germanium alloy material deposited on dielectric surfaces (such as surfaces of silicon oxide or silicon nitride) and amorphous or polycrystalline semiconductor surfaces are formed as amorphous or polycrystalline becomes amorphous or polycrystalline silicon germanium alloy portions.

The silicon germanium alloy portions can be formed as undoped silicon germanium alloy portions or doped silicon germanium alloy portions having a p-type doping or an n-type doping. In one embodiment, the silicon germanium alloy portions can be formed as undoped silicon germanium alloy portions. In this case, the fourth shut-off value 42 is shut, and the fourth MFC 40 can be controlled not to allow any flow of the dopant gas.

In another embodiment, the silicon germanium alloy portions can be formed as doped silicon germanium alloy portions having a p-type doping or n-type doping. Deposition of boron-doped silicon germanium alloy material can be performed by in-situ doping of the silicon germanium alloy. For example, the silicon germanium alloy portions can be formed as boron-doped (i.e., B-doped) silicon germanium alloy portions. In this case, a dopant gas including boron such as diborane can be flowed into a reaction chamber concurrently with the silicon precursor and the germanium precursor. The fourth shut-off valve 42 is opened, and the fourth MFC can be controlled to flow the dopant gas into the process chamber 80.

In one embodiment, the dopant gas can be diborane, and the deposited silicon germanium alloy material can be doped with boron at a boron concentration from $1.0 \times 10^{17}/cm^3$ to $3.0 \times 10^{21}/cm^3$, although lesser and greater boron concentrations can also be employed. In another embodiment, the deposited silicon germanium alloy material can be doped with boron at a boron concentration from $1.0 \times 10^{19}/cm^3$ to $2.0 \times 10^{21}/cm^3$. In yet another embodiment, the deposited silicon germanium alloy material can be doped with boron at a boron concentration from $1.0 \times 10^{20}/cm^3$ to $1.0 \times 10^{21}/cm^3$.

Referring to FIG. 2, during each etch step, the undoped or doped silicon germanium alloy material portions are etched from the wafer. The etch rate of the undoped or doped silicon germanium alloy material is dependent on the crystalline structure. Specifically, single crystalline undoped or doped silicon germanium alloy material is etched at a lower etch rate than amorphous or polycrystalline silicon germanium alloy material. Thus, all amorphous or polycrystalline silicon germanium alloy material deposited in the previous deposition cycle can be removed in the etch step, while a fraction of each epitaxial silicon germanium alloy portion deposited during the previous deposition step remains on the wafer 82 at the end of each etch step.

The fifth shut-off value 52 and at least one of the third shut-off value 32 and the optional seventh shut-off valve 72 are opened, and the fifth MFC 50 and at least one of the third MFC 30 and the optional seventh MFC 70 are controlled to allow simultaneous flow of the hydrogen chloride gas and a germanium-containing gas into the process chamber 80. The germanium-containing gas that is flowed into the process chamber includes at least one of the germanium precursor gas that flows through the third MFC 30 and the germanium-containing gas that is different from the germanium precursor gas and flows through the optional seventh MFC 70. Thus, the germanium-containing can include at least of germane (GeH$_4$), digermane (Ge$_2$H$_6$), germanium tetrachloride (GeCl$_4$), and germanium tetrafluoride (GeF$_4$).

While the etch rate of hydrogen chloride at temperatures lower than 625° C. is negligible, the etch rate of the combination of hydrogen chloride and the germanium-containing gas that is simultaneously flowed into the process chamber 80 is significantly enhanced over the etch rate of hydrogen chloride at temperatures lower than 625° C. Without wishing to be bound by any theory, it is conjectured that the mechanism for significantly enhancing the etch rate and the germanium concentration may be the interaction of hydrogen chloride with the germanium-containing gas. Thus, addition of the germanium-containing gas enhances the etch rate during the etch step so as to provide a significant etch rate for silicon germanium alloy materials in the temperature range from 400° C. to 550° C. The germanium-containing gas can be, for example, germane (GeH$_4$), digermane (Ge$_2$H$_6$), germanium tetrachloride (GeCl$_4$), germanium tetrafluoride (GeF$_4$), or combinations thereof.

In one embodiment, the germanium-containing gas is the germanium precursor gas, and is provided through the third MFC 30 and the third valve 32. In this case, the germanium-containing gas employed during the etch step can be germane or digermane.

In another embodiment, the germanium-containing gas is the germanium-containing gas that is different from the germanium precursor gas, and is provided through the seventh MFC 70 and the seventh valve 72. In one case, the germanium precursor gas can be germane, and the germanium-containing gas flowed during the etch process can be digermane, germanium tetrachloride (GeCl$_4$), germanium tetrafluoride, or combinations thereof. In another case, the germanium precursor gas can be digermane, and the germanium-containing gas flowed during the etch process can be germane, germanium tetrachloride (GeCl$_4$), germanium tetrafluoride, or combinations thereof. In yet another case, the germanium precursor gas can be germanium tetrachloride, and the germanium-containing gas flowed during the etch process can be germane, digermane, germanium tetrafluoride, or combinations thereof.

In yet another embodiment, the germanium-containing gas can be a combination of the germanium precursor gas that is flowed through the third MFC 30 and the third valve 32 and another germanium-containing gas that is different from the germanium precursor gas, which is provided through the seventh MFC 70 and the seventh valve 72.

The partial pressure of the hydrogen chloride gas during the etch step can be from 1 Torr to 300 Torr. The partial pressure of the germanium-containing gas during the etch step can be from 0.1 mTorr to 10 Torr. The ratio of the partial pressure of the hydrogen chloride gas to the partial pressure of the germanium-containing gas can be from 5 to 100,000, although lesser and greater ratios can also be employed. The total pressure of the process chamber 80 during the etch step can be from about 1 Torr to 300 Torr, although lesser and greater pressures can also be employed.

The temperature of the wafer 84 during the etch step can be in a range from, and including, 400° C. to, and including, 580° C. In one embodiment, the temperature of the wafer 84 during the etch step can be in a range from, and including, 430° C. to, and including, 560° C. In yet another embodiment, the temperature of the wafer 84 during the etch step can be in a range from, and including, 460° C. to, and including, 540° C.

In one embodiment, the temperature of the wafer 84 during the etch step can be the same as the temperature of the wafer 84 during the deposition step. In another embodiment, the temperature of the wafer 84 can be elevated during each etch step above the temperature of the deposition step, for example, by a temperature differential greater than 0° C. and less than 540° C.

A selectivity ratio is defined as the etch rate for an amorphous or polycrystalline film divided by the etch rate of an epitaxial film having a same composition as the amorphous or polycrystalline film. The use of a germanium-containing gas during the etch step provides a selectivity ratio greater than 1.0 at processing temperatures less than 580° C. In one embodiment, the use of a germanium-containing gas during the etch step provides a selectivity ratio greater than 1.0 for doped or undoped silicon germanium alloy materials deposited and etched at a temperature at, or lower than, 550° C.

In one embodiment, selectivity ratios greater than 2.0 can be provided during the etch step. In another embodiment, selectivity ratios greater than 4.0 can be provided during the etch step. In yet another embodiment, selectivity ratios greater than 7.0 can be provided during the etch step.

The etch rate for single crystalline silicon germanium alloy materials of the etch process can be from 1 nm/min to 100 nm/min, although lesser and greater etch rates can also be employed. In one embodiment, the etch rate for single crystalline silicon germanium alloy materials of the etch process can be from 10 nm/min to 80 nm/min. In another embodiment, the etch rate for single crystalline silicon germanium alloy materials of the etch process can be from 20 nm/min to 60 nm/min.

The deposited doped or undoped silicon germanium alloy materials deposited on dielectric surfaces tend to become less amorphous and more polycrystalline with increasing deposition temperature. For a given germanium concentration in a silicon germanium alloy material, the lower the deposition temperature, the greater the selectivity ratio and the greater the critical thickness beyond which a film of the silicon germanium alloy material relaxes.

In one embodiment, an epitaxial silicon germanium alloy material having a germanium concentration greater than 60 atomic percent can be selectivity deposited in a temperature range from 450° C. to 480° C.

In one embodiment, a relatively small amount of hydrogen chloride can be flowed into the process chamber 80 during each deposition step. The presence of hydrogen chloride during the deposition step improves the quality of epitaxial silicon germanium alloy material in terms of single crystallinity of the deposited silicon germanium alloy material (i.e., the degree of alignment in the epitaxial silicon germanium alloy material). This effect was experimentally confirmed by comparing X-ray diffraction spectra of a first epitaxial silicon germanium alloy material deposited employing a deposition step in which hydrogen chloride was flowed with tetrasilane ($Si_4H_{10}$) and germane and a second epitaxial silicon germanium alloy material deposited employing a deposition step in which hydrogen chloride was not flowed while tetrasilane and germane were flowed. Fringe peaks were present in the XRD spectra of the first epitaxial silicon germanium alloy material, while fringe peaks were not present in the XRD spectra of the second epitaxial silicon germanium alloy material.

In one embodiment, the flow rate of hydrogen chloride during each deposition step can be from 0.1% to 100% of the combined flow rate of the high order silane gas and the germanium precursor gas, although lesser and greater percentages can also be employed. In another embodiment, the flow rate of hydrogen chloride during each deposition step can be from 0.5% to 10% of the combined flow rate of the high order silane gas and the germanium precursor gas.

In one embodiment, the methods of the present disclosure can be employed to embed epitaxial silicon germanium alloys in a source and/or a drain region of a field effect transistor including a silicon channel to provide a compressive stress along the lengthwise direction of the channel, i.e., along the direction connecting the source region and the drain region of the field effect transistor. As used herein, a "field effect transistor" refers to any transistor that employs field effect to control the operation of the device, and includes metal-semiconductor-insulator (MOS) field effect transistors, junction field effect transistors, and all types of planar and fin-configuration variants thereof as known in the art.

EXAMPLES

Experimental

A study was performed employing a reduced pressure chemical vapor deposition (RPCVD) chamber configured to deposit a silicon germanium alloy on a 300 mm diameter substrate. The system that included the RPCVD chamber was a horizontal, single-wafer, multi-chamber system, including two load-lock chambers, a transfer chamber, and two process modules each including a process chamber. One of the two process chambers was the PPCVD chamber. The load-lock chambers were located before the transfer chamber to maintain a clean inert environment for transferring wafers in and out of the system. Each load-lock chamber was configured to hold up to 25 wafers.

In the process module including the RPCVD chamber (which is herein referred to as the "RPCVD module"), upper and lower lamp modules were used to radiantly heat the wafer and a susceptor through upper and lower quartz domes, which are parts of an enclosure in which the wafer is loaded for selective epitaxy. The temperature of the wafer was controlled by optical pyrometers and a closed loop proportional, integral, and derivative (PID) control system. The RPCVD chamber was configured to rotate the wafer and the susceptor during the selective epitaxy process during the selective epitaxy process. Process gases were flowed across, and over, the front surface of the wafer upon entering the process chamber at one side of the chamber, and exited the process chamber through an exhaust manifold located at the other side of the chamber.

The process module was equipped with liquid precursor delivery systems to provide vapors derived from liquid precursors into the RPCVD chamber through mass flow controllers (MFC's). Silicon germanium alloy films were deposited on both blanket silicon (001) substrates and patterned silicon (001) substrates. The blanket and patterned silicon (001) substrate had a light p-type doping corresponding to a resistivity of 7~10 Ω-cm. The deposition temperature was set at 500° C., and the pressure during the deposition process was 10 Torr.

Liquid vapor high order silanes ($Si_nH_{2n+2}$; n>3) were selected as the silicon source gas to achieve high growth rate at low temperature. The precursor vapor was delivered from a bubbler to the RPCVD chamber employing a hydrogen carrier gas. Germane (GeH$_4$) diluted at 10% in hydrogen gas was used as the Ge source gas. Boron dopant was introduced into the RPCVD chamber by flowing 1% diborane (B$_2$H$_6$) in hydrogen gas to the RPCVD chamber. An etch chemistry employing hydrogen chloride (HCl) and germane (GeH$_4$) was employed at 500° C., which was the same temperature as the deposition temperature for the boron-doped silicon germanium alloy material.

Due to the non-selective nature of deposition from high-order silanes as defined above, selective deposition on patterned wafers was achieved using an isothermal cyclic deposit and etch (CDE) process at 500° C. This isothermal process avoided cycling to higher temperature from deposition for the etch steps, and thus, was advantageous for providing high throughput and maintaining the strain in the deposited film by minimizing exposure to an elevated temperature during the etch steps.

The thickness and the substitutional Ge concentration in the epitaxial boron-doped silicon germanium alloy films were determined by high-resolution X-ray diffraction (XRD) data along the (004) direction. Secondary ion mass spectrometry (SIMS) measurements were performed to determine the total boron concentration and the total germanium concentration in the epitaxial boron-doped silicon germanium alloy films. A 500 eV O$_2^+$ beam was used to collect boron and germanium depth profiling information. Boron concentration was quantified with boron implant standards in silicon, and was subsequently corrected for the yield difference due to the germanium concentration. Germanium was quantified with a set of silicon germanium alloy samples and implant standards. Within error limits, the germanium concentration measured from SIMS matched the germanium concentration calculated by XRD. The measured germanium concentrations indicated a fully-strained silicon germanium alloy layer. Taping mode atomic force microscopy (AFM) was employed to study the surface roughness of the epitaxial boron-doped silicon germanium alloy films. The film quality and morphology were investigated by cross-sectional TEM.

EXAMPLES

Results

Figure 3:
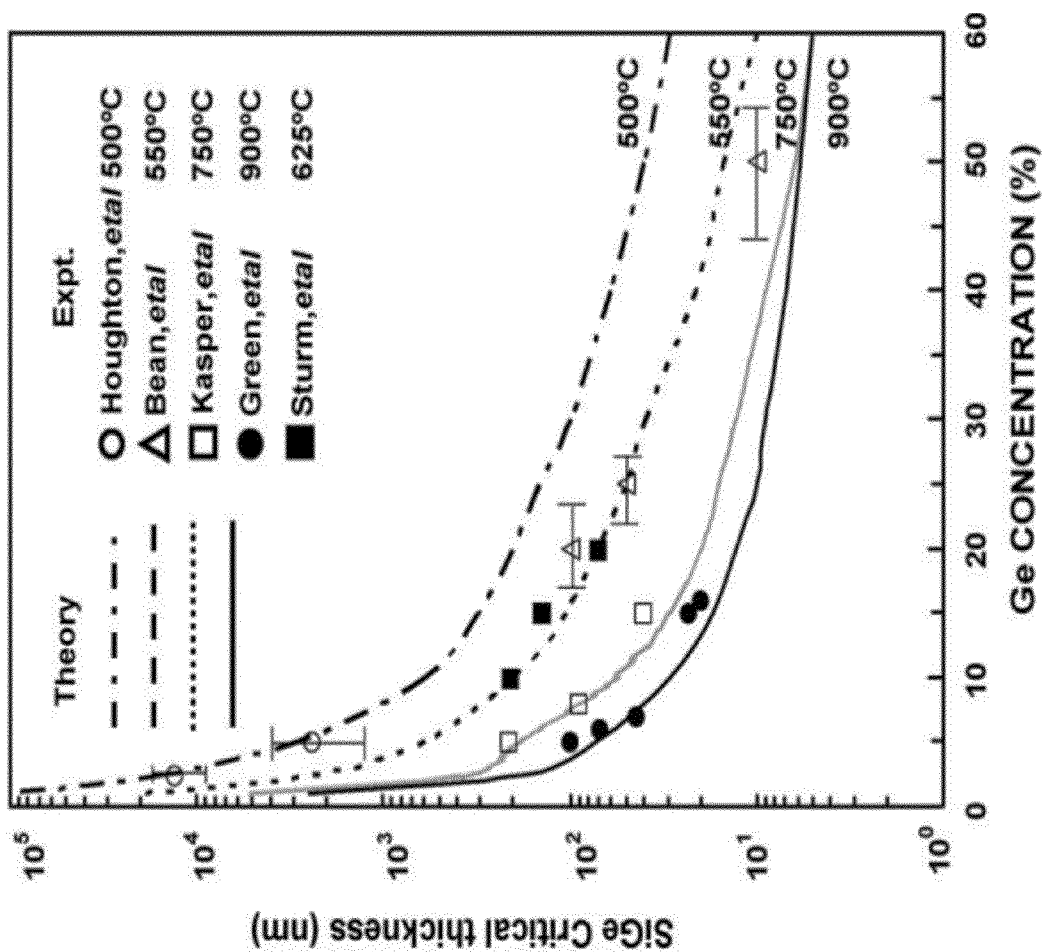
FIG. 3 illustrates the meta-stable critical thickness of silicon germanium alloys as a function of growth temperature.

The meta-stable critical thickness of silicon germanium alloys is a strong function of growth temperature as illustrated in FIG. 3. To incorporate fully-strained germanium at a concentration of 45 atomic percent or greater in a 60 nm thick epitaxial silicon germanium alloy film grown on a silicon surface, deposition temperature of the silicon germanium alloy film should not exceed 500° C.

Figure 4:
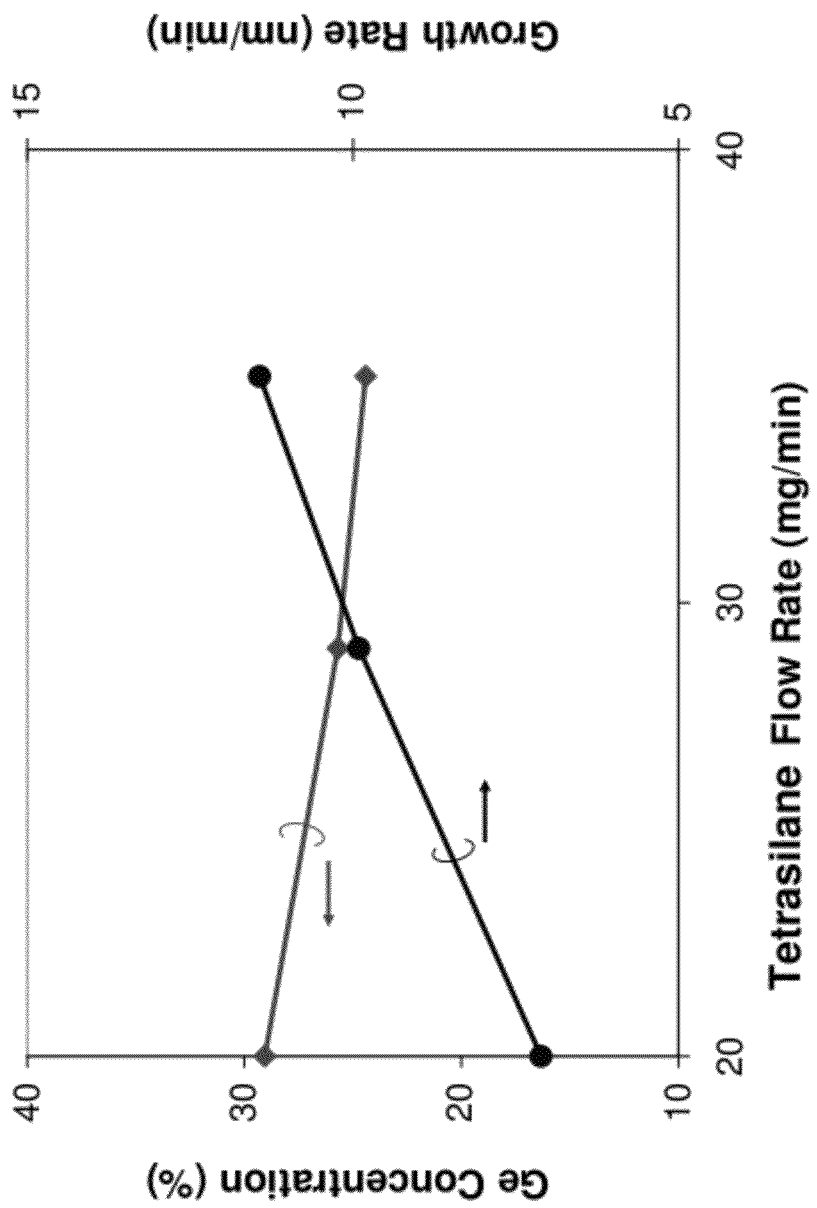
FIG. 4 illustrates the germanium concentrations and growth rates corresponding to selected values of flow rates for tetrasilane ($Si_4H_{10}$) with 280 sccm of germane flow at the deposition temperature of 500° C. according to an embodiment of the present disclosure.

Different flow rates for tetrasilane (Si$_4$H$_{10}$) were employed in combination with 280 standard cubic centimeter per minute (sccm) of GeH$_4$ flow at 500° C. at the deposition temperature. The germanium concentrations and growth rates corresponding to selected values of flow rates for tetrasilane (Si$_4$H$_{10}$) are shown in FIG. 4. Increasing the flow rate for tetrasilane (Si$_4$H$_{10}$) resulted in higher growth rates and lower germanium concentration in the silicon germanium alloy films. Higher germanium concentrations can be achieved by reducing the flow rate of tetrasilane (Si$_4$H$_{10}$) below 20 mg/min.

Below a certain threshold value of the tetrasilane (Si$_4$H$_{10}$) gas flow, most of the molecules of the tetrasilane (Si$_4$H$_{10}$) gas decomposed and reacted rapidly in the injection area (i.e., depleted before reaching the center of the wafer), resulting in bad film quality and extremely non-uniform deposition rate across the wafer despite the rotation of the wafer during the deposition process.

Figure 5:
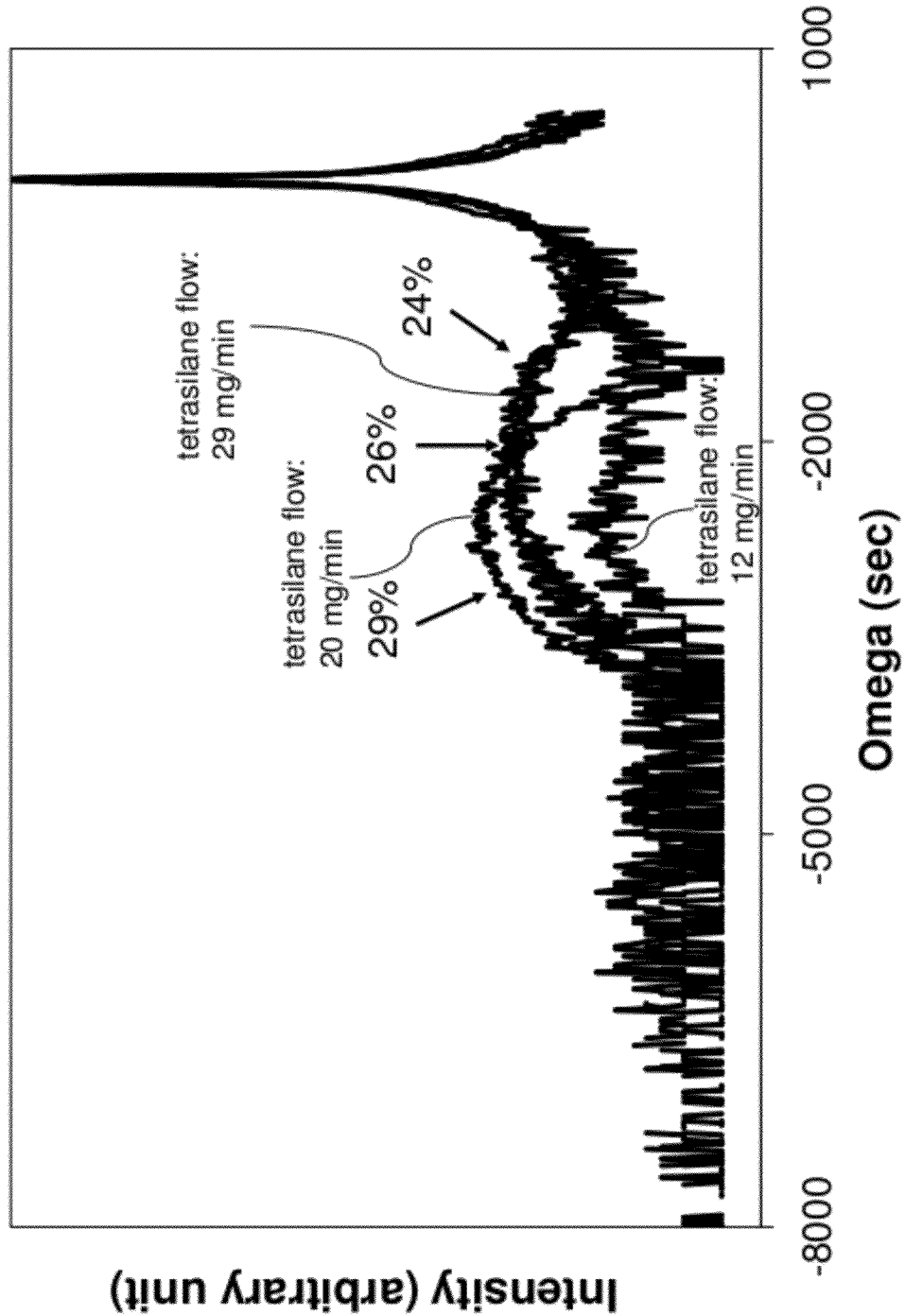
FIG. 5 is a high resolution X-ray diffraction (XRD) data along (004) direction of the silicon germanium alloy films that were deposited employing the methods of the present disclosure.

Referring to FIG. 5, the silicon germanium alloy films showed single crystallinity in XRD measurement data for the tetrasilane (Si$_4$H$_{10}$) gas flow rate equal to, or grater than, 20 mg/min. At the tetrasilane (Si$_4$H$_{10}$) gas flow rate of 12 mg/min, the strained silicon-germanium peak and thickness fringes disappeared from the XRD data, indicating that the silicon germanium film formed at the tetrasilane (Si$_4$H$_{10}$) gas flow rate of 12 mg/min was no longer epitaxially strained.

Figure 6:
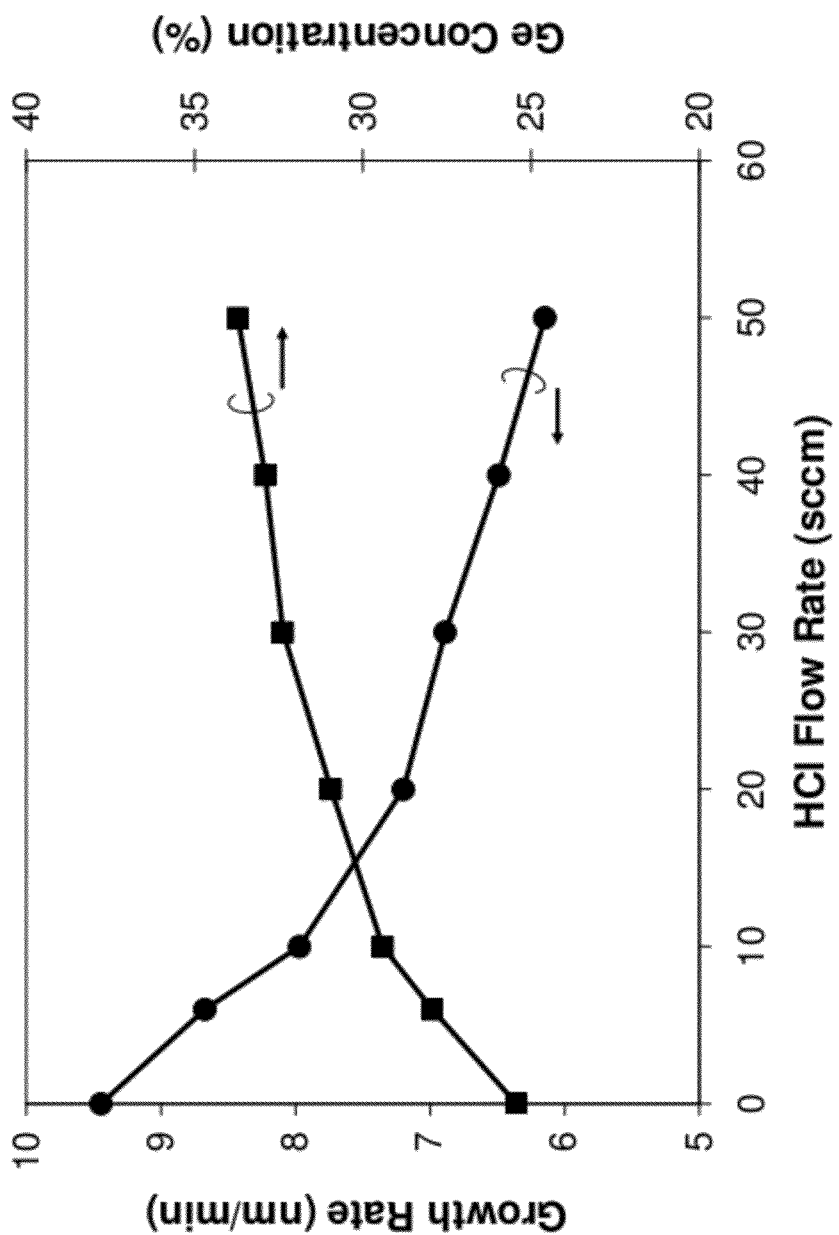
FIG. 6 is a graph illustrating the effects of introduction of hydrogen chloride etchant during the deposition step on the growth rate and the germanium concentration.

To further increase the germanium concentration, hydrogen chloride was introduced in the deposition step. Referring to FIG. 6, the effects of introduction of hydrogen chloride etchant during the deposition step on the growth rate and the germanium concentration are illustrated. Although the etch rate of hydrogen chloride was negligible at 500° C., the introduction of hydrogen chloride in the deposition reduced the growth rate significantly and increased the germanium concentration significantly.

With the introduction of hydrogen chloride, a germanium concentration of 34 atomic percent was demonstrated at the tetrasilane (Si$_4$H$_{10}$) gas flow rate of 29 mg/min, and a germanium concentration of 38 atomic percent was demonstrated at the tetrasilane (Si$_4$H$_{10}$) gas flow rate of 20 mg/min. The root mean squared (RMS) film surface roughness, as measured by atomic force microscopy (AFM), was 0.126 nm for the silicon germanium alloy film having the germanium concentration of 34 atomic percent, and was 0.165 nm for the silicon germanium alloy film having the germanium concentration of 38 atomic percent. Thus, the measured surface roughness was on the order of the thickness of an atomic layer (0.135 nm). The growth rate decreases from 6.3 nm/min to 4.1 nm/min when the tetrasilane (Si$_4$H$_{10}$) gas flow rate decreases from 29 mg/min to 20 mg/min. The tetrasilane (Si$_4$H$_{10}$) gas flow rate of 29 mg/min was selected for further study due to the higher growth rate compared with the growth rate obtained at the tetrasilane (Si$_4$H$_{10}$) gas flow rate of 20 mg/min.

Lower limit values are summarized for selectivity ratios under various process conditions in Table 1.

TABLE 1

| Selectivity Ratios at different process conditions. | | | | | | |
|---|---|---|---|---|---|---|
| Temperature (° C.) | Germanium Concentration (atomic %) | Boron Concentration (atoms/cm$^3$) | Growth Rate (nm/min) | Etch rate for epitaxial films (nm/min) | Lower limit value for etch rate for amorphous or polycrystalline films (nm/min) | Lower limit value for selectivity Ratio |
| 500 | 15 | 0 | 8 | 3 | 24 | 8 |
| 500 | 24 | 0 | 10 | 4 | 13 | 3.3 |
| 500 | 34 | 0 | 9 | 3 | 6 | 2 |

TABLE 1-continued

Selectivity Ratios at different process conditions.

| Temperature (° C.) | Germanium Concentration (atomic %) | Boron Concentration (atoms/cm$^3$) | Growth Rate (nm/min) | Etch rate for epitaxial films (nm/min) | Lower limit value for etch rate for amorphous or poly-crystalline films (nm/min) | Lower limit value for selectivity Ratio |
|---|---|---|---|---|---|---|
| 500 | 40 | $2.0 \times 10^{19}$ | 11 | 8 | 15 | 2 |
| 500 | 38 | $2.0 \times 10^{20}$ | 11 | 7 | 13 | 2 |

The growth rate and etch rate were extracted from XRD thickness measurements, performed before and after the etch step, on the silicon germanium alloy films formed on blanket wafers. Single crystalline silicon substrates were employed to form epitaxial silicon germanium alloy films, and substrates including a 100 nm thick silicon oxide layer on the topmost portion were employed to form amorphous or polycrystalline silicon germanium alloy films. For each process condition, at least one single crystalline silicon substrate and at least one substrate including a 100 nm thick silicon oxide layer were employed to form epitaxial and amorphous/polycrystalline silicon germanium alloy films, respectively.

Although amorphous and polycrystalline layers are deposited at a greater deposition rate than the corresponding epitaxial layer under the same process conditions, the calculated etch rates for amorphous/polycrystalline layers were based on the growth rate of the corresponding epitaxial layer. Thus, the calculated etch rates for the amorphous/polycrystalline layers are lower limit values for the actual etch rates for the amorphous/polycrystalline layers, i.e., are less than the actual values for the etch rates for the amorphous/polycrystalline layers. Correspondingly, the calculated selectivity ratios are lower limit values for the actual selectivity ratios, i.e., are less than the actual values for the selectivity ratios.

High concentration concentrations tended to cause the silicon germanium alloy layers to become more polycrystalline than amorphous. Thus, the selectivity ratio at 500° C. decreased with increasing germanium concentration in the silicon germanium alloy film.

Both the growth rate and etch rate increased with the introduction of diborane ($B_2H_6$) for in-situ doping. The selectivity ratio did not change significantly with the introduction of diborane.

It is noted that higher growth temperatures caused silicon germanium alloy films deposited on dielectric surfaces to become more polycrystalline than amorphous. Thus, lower growth temperature helped by improving the selectivity ratio. For this reason, growth temperatures less than 500° C. provided higher selectivity ratio for selective deposition of epitaxial silicon germanium alloy material with a germanium concentration of 45 atomic percent or greater.

Figure 7:
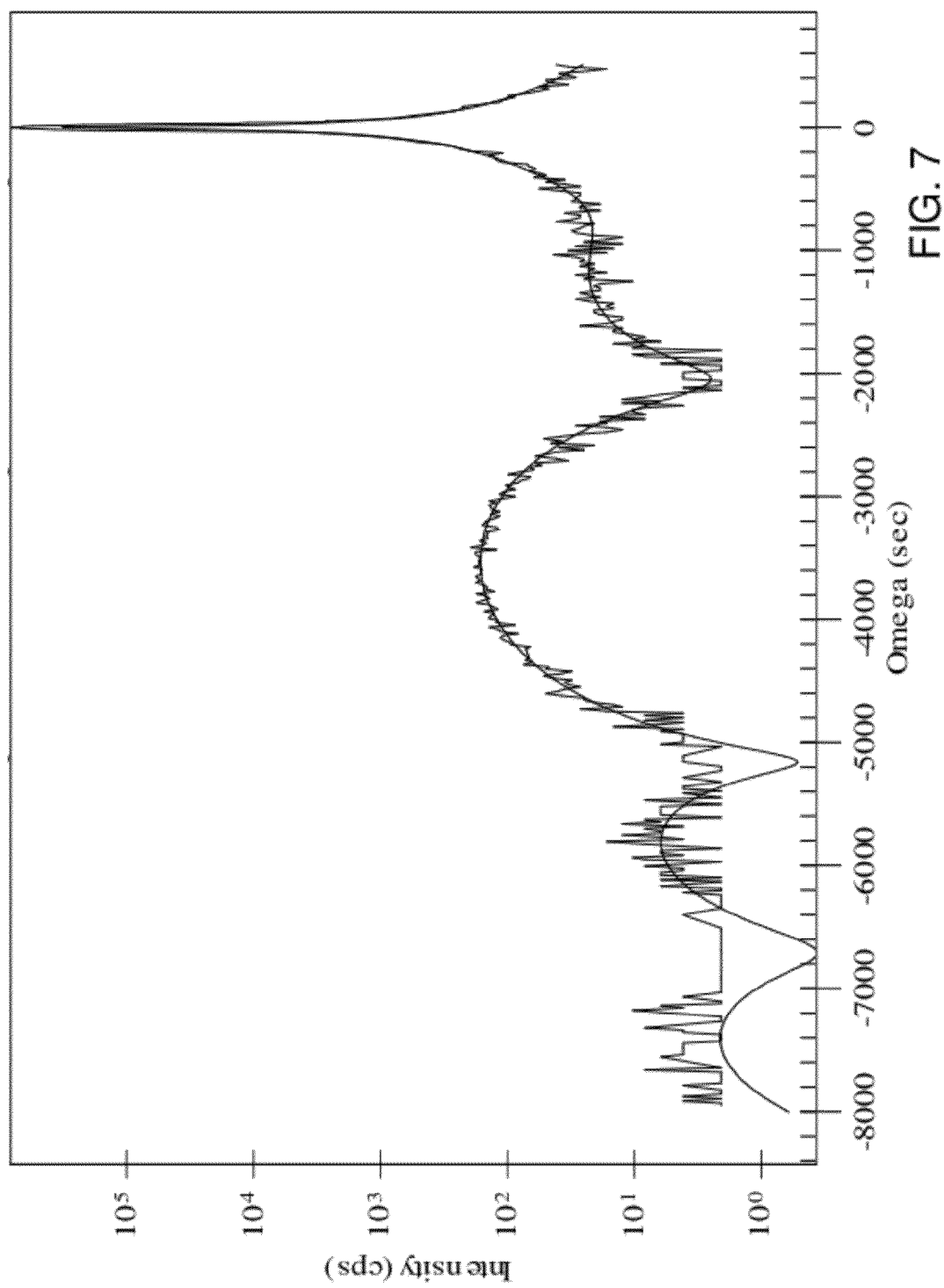
FIG. 7 shows the XRD data from an epitaxial silicon germanium alloy film having a germanium concentration of 38 atomic percent and a boron doping at $2.0 \times 10^{20}$ atoms/cm$^3$ and deposited employing the methods of the present disclosure.
Figure 8:
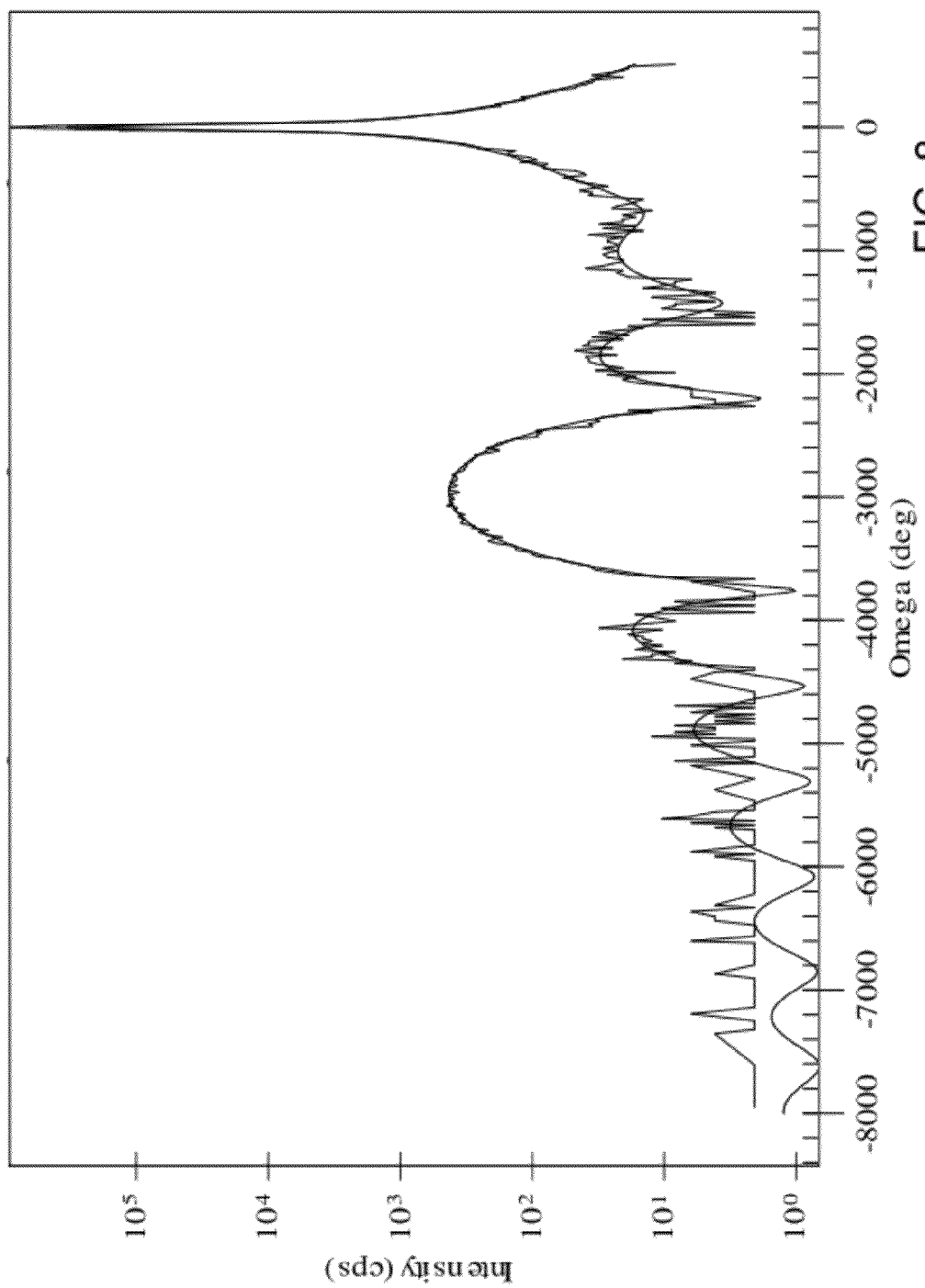
FIG. 8 shows the XRD data from an epitaxial silicon germanium alloy film having a germanium concentration of 15 atomic percent and a boron doping at $8.0 \times 10^{20}$ atoms/cm$^3$ and deposited employing the methods of the present disclosure.

The cyclic deposit and etch process was employed on blanket wafers to deposit B-doped silicon germanium alloy films. The XRD data from an epitaxial silicon germanium alloy film having a germanium concentration of 38 atomic percent and a boron doping at $2.0 \times 10^{20}$ atoms/cm$^3$ is shown in FIG. 7. The XRD data from an epitaxial silicon germanium alloy film having a germanium concentration of 15 atomic percent and a boron doping at $8.0 \times 10^{20}$ atoms/cm$^3$ is shown in FIG. 8. The germanium concentration and the boron concentration in the two silicon germanium alloy films of FIGS. 7 and 8 were confirmed by SIMS. Thickness fringes were present in the two XRD graphs of FIGS. 7 an 8, indicating good crystallinity of the boron-doped silicon germanium alloy films.

Figure 9:
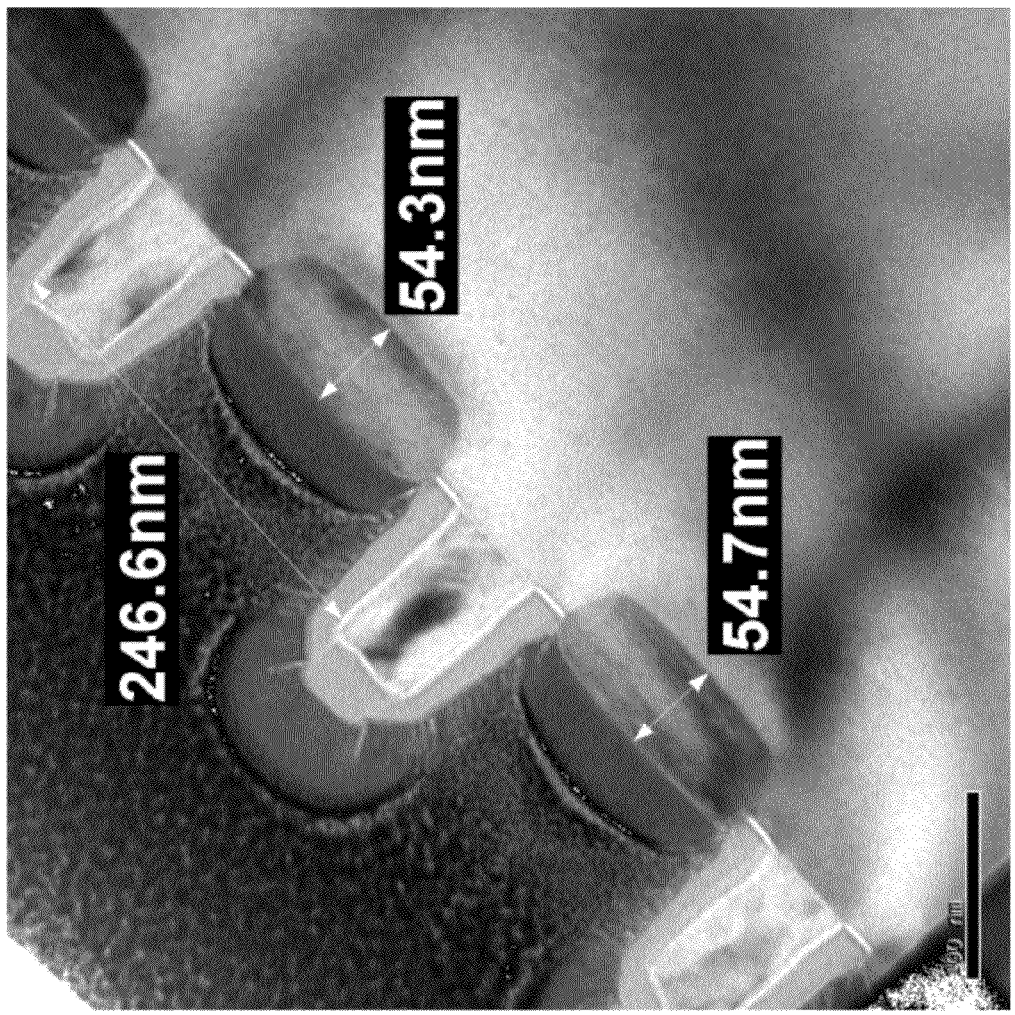
FIG. 9 is a cross-sectional transmission electron micrograph (TEM) image of an epitaxial silicon germanium alloy film having a germanium concentration of 38 atomic percent and a boron doping at $2.0 \times 10^{20}$ atoms/cm$^3$ and deposited on a patterned wafer including features having dimensions on the order of 65 nm.
Figure 10:
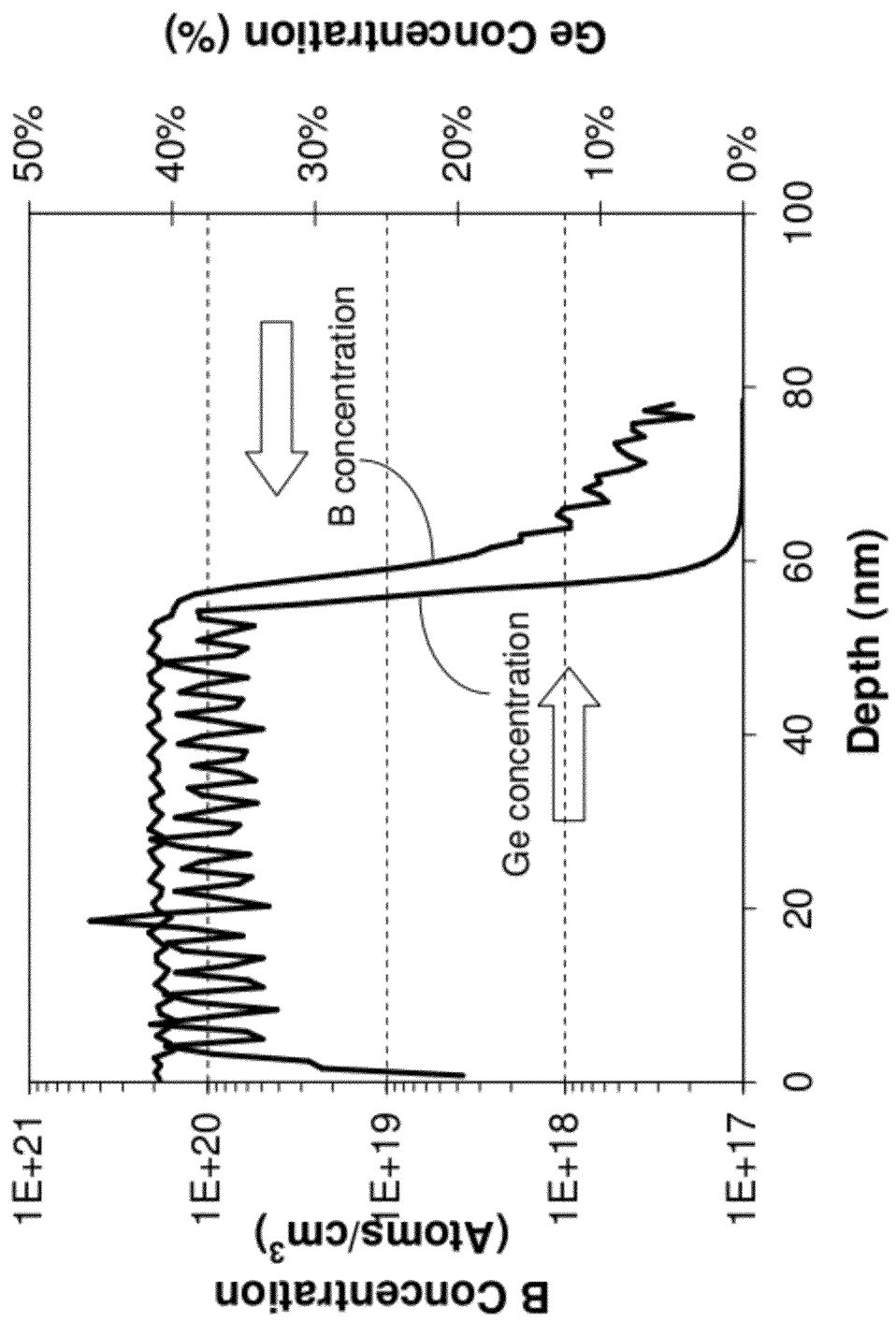
FIG. 10 is a secondary ion mass spectroscopy (SIMS) profile that illustrates the composition of the boron-doped silicon germanium alloy film of FIG. 9.

Another epitaxial silicon germanium alloy film having a germanium concentration of 38 atomic percent and a boron doping at $2.0 \times 10^{20}$ atoms/cm$^3$ was deposited on a patterned wafer including features having dimensions on the order of 65 nm to demonstrate process selectivity. A cross-sectional transmission electron micrograph (TEM) image is shown in FIG. 9. The composition of the boron-doped silicon germanium alloy film was verified by SIMS, as shown in FIG. 10. The TEM image showed that the process is selective to the dielectric materials of silicon oxide and silicon nitride. The thickness of the film was approximately 50 nm. No obvious defects were observed from the TEM image.

The demonstrated cyclical deposit and etch (CDE) processes for B-doped or undoped silicon germanium selective epitaxy were relatively high throughput processes providing throughputs of at least 2~2.5 wafers per hour (wph). The use of a high order silane ($Si_nH_{2n+2}$; n>3) liquid vapor silicon precursor and $GeH_4$ enabled deposition of silicon germanium alloy films at high growth rates and at temperatures lower than 650° C.

While the present disclosure has been particularly shown and described with respect to preferred embodiments thereof, it will be understood by those skilled in the art that the foregoing and other changes in forms and details may be made without departing from the spirit and scope of the present disclosure. Each of the various embodiments of the present disclosure can be implemented alone, or in combination with any other embodiments of the present disclosure unless expressly disclosed otherwise or otherwise impossible as would be known to one of ordinary skill in the art. It is therefore intended that the present disclosure not be limited to the exact forms and details described and illustrated, but fall within the scope of the appended claims.

What is claimed is:

1. A method of depositing a silicon germanium alloy material, said method comprising:
   performing at least one deposition step that deposits a silicon germanium alloy material on a substrate by flowing a high order silane gas having a chemical formula of $Si_nH_{2n+2}$ and a germanium precursor gas as reactant gases into a process chamber including said substrate, wherein n is an integer greater than 3; and
   performing at least one etch step that etches at least a portion of said deposited silicon germanium alloy material by flowing a combination of a hydrogen chloride gas and a germanium-containing gas into said process chamber.

2. The method of claim 1, wherein said at least one deposition step is performed at a deposition temperature in a range from, and including, 400° C. to, and including, 550° C.

3. The method of claim 2, wherein said at least one etch step is performed at an etch temperature in a range from, and including, 400° C. to, and including, 580° C.

4. The method of claim 3, wherein said etch temperature is the same as the deposition temperature.

5. The method of claim 3, wherein said etch temperature is higher than said deposition temperature.

6. The method of claim 5, wherein said etch temperature is higher than said deposition temperature by no more than 30° C.

7. The method of claim 1, wherein said at least one deposition step is performed at a deposition temperature in a range from, and including, 430° C. to, and including, 530° C.

8. The method of claim 7, wherein said at least one etch step is performed at an etch temperature in a range from, and including, 430° C. to, and including, 560° C.

9. The method of claim 1, wherein said at least one deposition step is performed at a deposition temperature in a range from, and including, 460° C. to, and including, 510° C.

10. The method of claim 9, wherein said at least one etch step is performed at an etch temperature in a range from, and including, 460° C. to, and including, 540° C.

11. The method of claim 1, wherein said germanium containing gas is a germanium hydride.

12. The method of claim 1, wherein said germanium containing gas is germanium chloride.

13. The method of claim 1, wherein said germanium containing gas is germanium fluoride.

14. The method of claim 1, wherein said germanium containing gas is selected from germane, digermane, germanium tetrachloride, and germanium tetrafluoride.

15. The method of claim 1, wherein said germanium containing gas is the same as said germanium precursor gas.

16. The method of claim 1, wherein said germanium containing gas is different from said germanium containing gas.

17. The method of claim 1, wherein said germanium precursor gas is germane.

18. The method of claim 1, wherein said germanium precursor gas is digermane.

19. The method of claim 1, wherein said germanium precursor gas is germanium tetrachloride.

20. The method of claim 1, wherein said silicon germanium alloy material is deposited on said substrate during said at least one deposition step within a process chamber at a pressure selected from a pressure range from 3 Torr to 300 Torr.

21. The method of claim 1, wherein said deposited silicon germanium alloy material is etched during said at least one etch step within a process chamber at a pressure selected from a pressure range from 1 Torr to 300 Torr.

22. The method of claim 1, further comprising flowing hydrogen chloride gas into said process chamber concurrently with flowing of said high order silane gas and said germanium precursor gas during said at least one deposition step.

23. The method of claim 22, wherein a flow rate of said hydrogen chloride gas during said deposition step is in a range from 0.1% to 100% of a combined flow rate of said high order silane gas and said germanium precursor gas.

24. The method of claim 1, wherein said high order silane gas is tetrasilane ($Si_4H_{10}$).

25. The method of claim 1, wherein said at least one deposition step and said at least one etch step are a series of alternately performed deposition steps and etch steps.

* * * * *